(12) United States Patent
Hissink et al.

(10) Patent No.: US 9,819,260 B2
(45) Date of Patent: Nov. 14, 2017

(54) INTEGRATED CIRCUIT CHARGE PUMP WITH FAILURE PROTECTION

(71) Applicant: NXP B.V., Eindhoven (NL)

(72) Inventors: Derk Jan Hissink, Nijmegen (NL); Jacobus Govert Sneep, Eindhoven (NL); Fred Mostert, Nijmegen (NL); Hendrikus van Iersel, Nijmegen (NL)

(73) Assignee: NXP B.V., Eindhoven (NL)

( * ) Notice: Subject to any disclaimer, the term of this patent is extended or adjusted under 35 U.S.C. 154(b) by 360 days.

(21) Appl. No.: 14/597,538

(22) Filed: Jan. 15, 2015

(65) Prior Publication Data

US 2016/0211739 A1    Jul. 21, 2016

(51) Int. Cl.
| | |
|---|---|
| H02M 3/07 | (2006.01) |
| H02M 1/32 | (2007.01) |
| H02M 1/36 | (2007.01) |
| H03F 3/217 | (2006.01) |
| H03F 1/52 | (2006.01) |
| H03F 3/185 | (2006.01) |

(52) U.S. Cl.
CPC ............ *H02M 3/073* (2013.01); *H02M 1/32* (2013.01); *H02M 1/36* (2013.01); *H02M 3/07* (2013.01); *H03F 1/523* (2013.01); *H03F 3/185* (2013.01); *H03F 3/2173* (2013.01); *H03F 2200/03* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 4,454,571 A | * | 6/1984 | Miyashita | G05F 3/205 327/530 |
| 5,675,279 A | * | 10/1997 | Fujimoto | H03K 17/063 327/178 |
| 5,889,427 A | * | 3/1999 | Nakajima | H02M 3/073 327/313 |
| 5,963,025 A | * | 10/1999 | Colli | H02M 3/073 323/288 |
| 6,040,736 A | * | 3/2000 | Milanesi | G05F 1/575 323/316 |

(Continued)

FOREIGN PATENT DOCUMENTS

| | | |
|---|---|---|
| EP | 1065784 A1 | 1/2001 |
| WO | WO-2008/133690 A1 | 11/2008 |

OTHER PUBLICATIONS

Extended European Search Report for Patent Appln. No. 16151143.1 (dated Jul. 13, 2016).

(Continued)

*Primary Examiner* — Thomas J Hiltunen

(57) ABSTRACT

Disclosed is a charge pump protection device including a power supply voltage, a charge pump to produce an output voltage higher than the power supply voltage, the charge pump including, a pumping capacitor to store voltage during a charging state and to discharge the voltage during a pumping state thereof, a plurality of switches to regulate the charging and pumping states, a charge pump capacitor to store the output voltage, and at least one current limiter in series with at least one of the plurality of switches to limit current and prevent an electrical failure of the charge pump.

18 Claims, 5 Drawing Sheets

(56) References Cited

U.S. PATENT DOCUMENTS

| | | | | |
|---|---|---|---|---|
| 6,226,194 B1* | 5/2001 | Bayer | ............... | H02M 3/07 307/110 |
| 6,373,333 B2* | 4/2002 | Egnot | ............... | H03K 19/007 327/20 |
| 6,445,623 B1* | 9/2002 | Zhang | ............... | G11C 5/145 365/189.11 |
| 6,618,296 B2 | 9/2003 | Zhang | | |
| 6,738,272 B2 | 5/2004 | Yamanaka et al. | | |
| 6,744,224 B2 | 6/2004 | Ishii | | |
| 6,794,926 B2 | 9/2004 | Rader et al. | | |
| 6,989,999 B2* | 1/2006 | Muramatsu | ............... | H02M 3/07 327/536 |
| 7,142,050 B2* | 11/2006 | Risbo | ............... | H03F 3/217 330/10 |
| 7,304,529 B2* | 12/2007 | Armaroli | ............... | H02M 3/07 327/536 |
| 7,466,188 B2* | 12/2008 | Fifield | ............... | G11C 5/145 327/536 |
| 7,545,658 B2* | 6/2009 | Thiele | ............... | H02M 3/07 307/110 |
| 7,554,385 B2* | 6/2009 | Ishida | ............... | H02M 3/07 327/170 |
| 7,605,638 B2* | 10/2009 | Nagasawa | ............... | H02M 1/36 327/536 |
| 7,902,908 B2* | 3/2011 | Chaoui | ............... | H03K 17/063 323/282 |
| 8,013,664 B2* | 9/2011 | Gerber | ............... | H02M 3/07 327/536 |
| 8,198,869 B2* | 6/2012 | Yang | ............... | H02M 3/07 320/121 |
| 8,344,791 B2* | 1/2013 | Adkins | ............... | H02M 3/07 327/536 |
| 8,619,444 B2* | 12/2013 | Kawasoe | ............... | G09G 3/3696 307/109 |
| 9,172,300 B2* | 10/2015 | Li | ............... | H02M 3/07 |
| 9,484,799 B2* | 11/2016 | Zhang | ............... | H02M 3/158 |
| 9,564,794 B2* | 2/2017 | Ku | ............... | H02M 1/14 |
| 2005/0104651 A1 | 5/2005 | Hashimoto | | |
| 2007/0013434 A1 | 1/2007 | Peschke | | |
| 2007/0024347 A1* | 2/2007 | Nagasawa | ............... | H02M 3/07 327/536 |
| 2008/0030261 A1* | 2/2008 | Nakata | ............... | H02M 3/07 327/536 |

OTHER PUBLICATIONS

5 Channel Class-D Power Amplifier with digital inputs, TDF8533—Functional Requirement Specification, Dec. 15, 2011.

Dickson, "On-Chip High-Voltage Generation in MNOS Integrated Circuits Using and Improved Voltage Multiplier Technique", IEEE Journal of Solid-State Circuits, Jun. 1976, 374-378.

Koerts, "Audio Amplifiers—BAP2-5.0-ADS", IC Archirect, Apr. 12, 2012.

Sheep, "Study Report", CTO SoCDT-Integrated Circuits Laboratory, 2009.

* cited by examiner

INTEGRATED CIRCUIT CHARGE PUMP WITH FAILURE PROTECTION

TECHNICAL FIELD

An issue in electrical systems engineering is a subsystem whose power requirements are not met by the main supply. In cases, available supply rails are not directly usable, nor is the direct use of battery voltage often available. Lack of space can prevent inclusion of an optimal number of battery cells, or the declining voltage of a discharging battery may not be acceptable for the application.

Voltage converters can generate desired voltage levels, and charge pumps are often a good choice for applications requiring some combination of additional power, simplicity, and low cost. Charge pumps are easy to use, because they require no expensive inductors or additional semiconductors.

SUMMARY

A brief summary of various embodiments is presented below. Some simplifications and omissions may be made in the following summary, which is intended to highlight and introduce some aspects of the various embodiments, but not to limit the scope of the embodiments described herein. Detailed descriptions of embodiments adequate to allow those of ordinary skill in the art to make and use the inventive concepts will follow in later sections.

According to one embodiment, there may be provided a charge pump protection device including a power supply configured to produce a power supply voltage, a charge pump configured to produce an output voltage higher than the power supply voltage, the charge pump including, a pumping capacitor configured to store charge during a charging state and to discharge the charge during a pumping state thereof, a plurality of switches configured to regulate the charging and pumping states, a charge pump capacitor configured to store the output charge, and at least one current limiter in series with at least one of the plurality of switches configured to limit current and prevent an electrical failure of the charge pump.

The device may include a second charge pump configured to produce a second voltage lower than the power supply voltage, the second voltage being a part of the output voltage.

The second voltage may be superimposed on a pumping capacitor voltage to produce the output voltage. Alternatively, a pumping capacitor voltage may be superimposed on the second voltage to produce the output voltage. The second charge pump circuit may include a Dickson charge pump.

The charge pump protection circuit may protect a first terminal of the pumping capacitor.

The at least one current limiter may include a first current limiter in series with a first switch to protect the pumping capacitor node during a charging cycle. The first current limiter may include a MOS current mirror.

The at least one current limiter may include a second current limiter in series with a second switch to protect the pumping capacitor node during a pumping cycle.

The device may include a terminal of the pumping capacitor between the pumping capacitor and the charge pump capacitor and an electrical element to limit the current flow. The electrical element may be a diode. The electrical element may be a MOS transistor switch.

Voltage stored in the charge pump capacitor may be used to power a high-side gate driver of a class D audio amplifier.

The device may include a clock circuit to control timing within the charge pump detection circuit.

According to another embodiment, there may be provided a charge pump detection device including a power supply configured to produce a power supply voltage, a charge pump configured to produce an output voltage higher than the power supply voltage, the charge pump including a pumping capacitor to store voltage during a charging state and discharge the voltage during a pumping state, and a start-up protection circuit configured to protect a terminal of the charge pump capacitor during a start-up event including a current limiter positioned between the power supply and the terminal of the charge pump capacitor to limit current and prevent electrical overstress.

The start-up protection circuit may include a MOS transistor that is open at the beginning of a clock cycle.

When it is determined that the output voltage exceeds the power supply voltage, the MOS transistor may be closed and the start-up protection circuit may be bypassed.

The start-up protection circuit may include a current mirror.

The device may include a second charge pump configured to produce a second voltage lower than the power supply voltage, the second voltage being a part of the output voltage. The start-up protection circuit may be activated when the output voltage is determined not higher than the power supply voltage.

BRIEF DESCRIPTION OF THE DRAWINGS

Embodiments discussed herein are described in more detail and by way of non-limiting examples with reference to the accompanying drawings, wherein.

DETAILED DESCRIPTION

Figure 1:
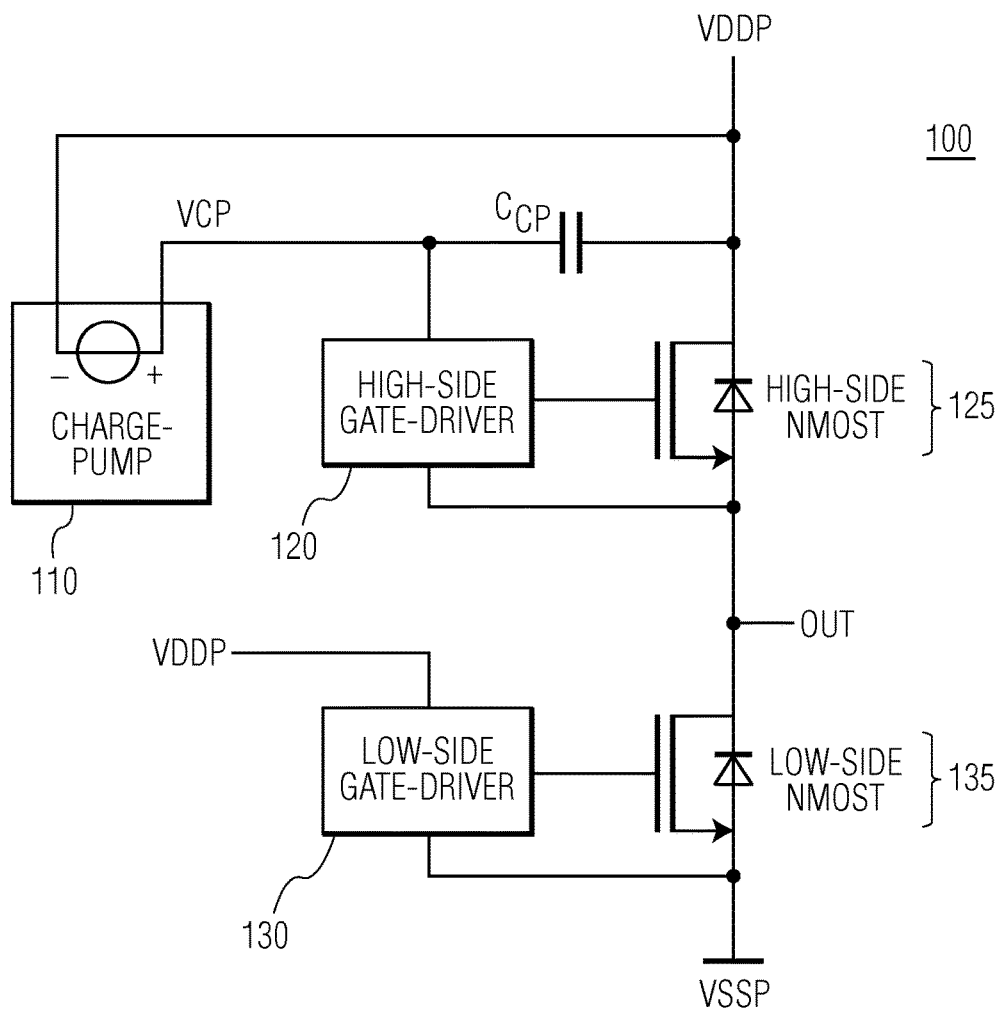
FIG. 1 illustrates a schematic system overview of a charge pump and power stage of a class D audio amplifier in accordance with an embodiment.

Reference is made herein to the attached drawings. Like reference numerals are used throughout the drawings to depict like or similar elements of the integrated charge pump device.

Capacitive voltage conversion may be achieved by switching a capacitor periodically. Passive diodes can perform this switching function in the simplest cases, if an alternating voltage is available. Otherwise, DC voltage levels may use active switches, which first charge a capacitor by connecting it across a voltage source and then connect it to the output in a way that produces a different voltage level.

Described herein is a charge pump that can be used with a class D audio amplifier. Charge pumps are widely used to generate voltages beyond supply range. For a class D audio amplifier, a voltage above the power supply voltage (battery)

is desired in order to drive the high side transistors of the class D power stage. These transistors may be NMOS, and the gate of the transistors can be driven at a voltage higher than the power supply voltage.

FIG. 1 illustrates a schematic system overview of a charge pump 110 and power stage of a class D audio amplifier in accordance with an embodiment. For simplicity one branch of a Bridge Tied Load (BTL) audio amplifier 100 output is illustrated.

Used in audio applications, a load such as a speaker is connected between two audio amplifier outputs. The load is said to "bridge" the two output terminals. This configuration can double the voltage swing at the speaker, as compared to a speaker that is connected to ground. A ground-tied speaker can only have a swing from zero to the amplifier's supply voltage. In contrast, a BTL-driven speaker can see twice this swing because the amplifier can drive either the (+) terminal of the speaker or the (−) terminal, effectively doubling the voltage swing. Since twice the voltage means four times the power, this is beneficial, especially in applications where battery size dictates a lower supply voltage, for example automotive or handheld applications.

As illustrated in FIG. 1, a gate of a low-side NMOS transistor 135 is controlled by a low-side driver 130 which is supplied from the VDDP power supply. A high-side NMOS power transistor 125 is controlled by a high-side gate driver 120. The charge pump 110 acts as a voltage source providing a fixed voltage VCP higher than VDDP to the high-side driver 120. Capacitor $C_{CP}$ is a charge pump output capacitor used to store VCP and to buffer any fast transient currents required by the high-side driver circuit 120. As will be described herein, with the addition of an internally created voltage $V_{INT}$, the charge pump 110 may create the output voltage VCP that is higher in magnitude than the system voltage VDDP.

Figure 2:
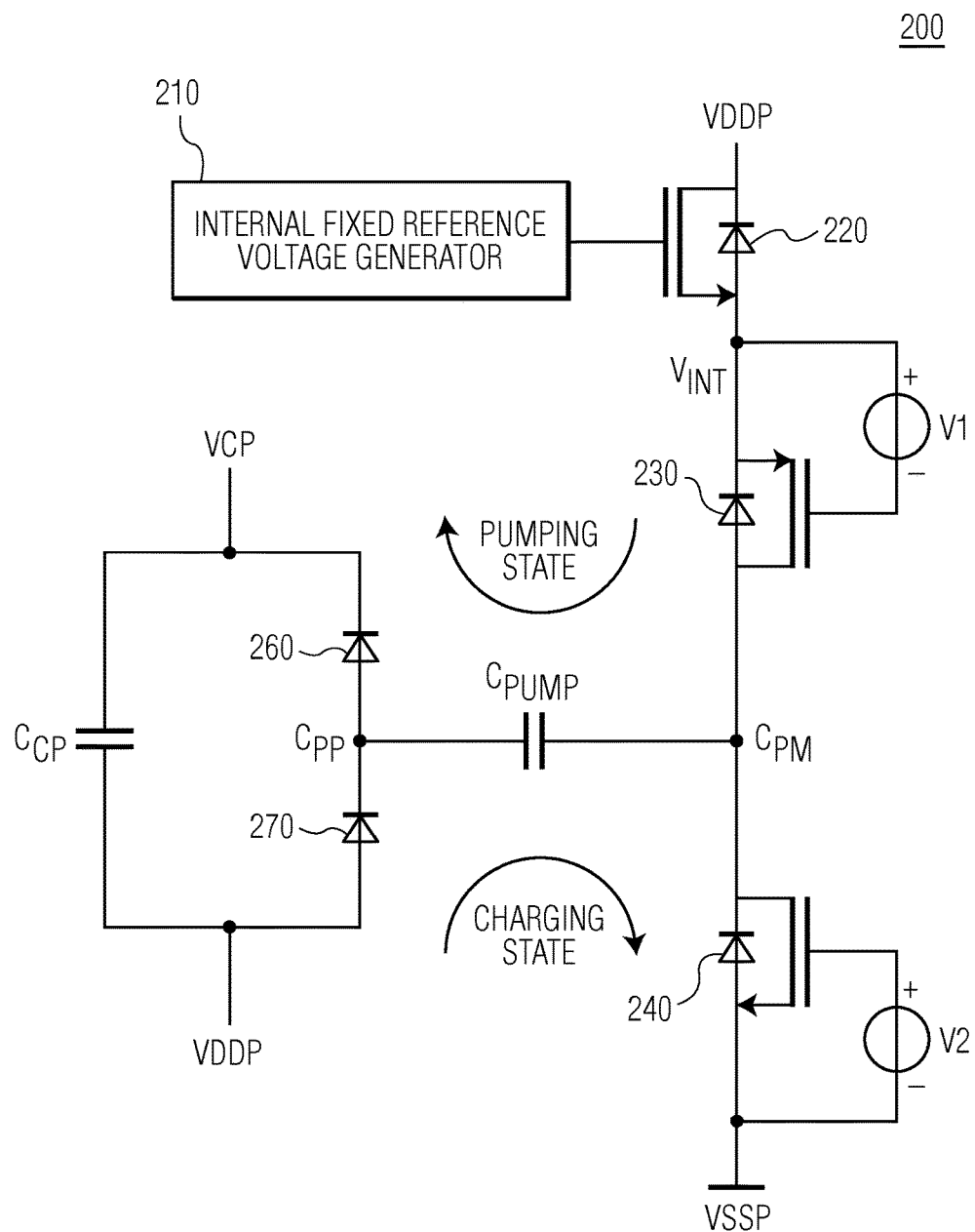
FIG. 2 illustrates a charge pump implementation in accordance with an embodiment.

FIG. 2 illustrates a charge pump implementation in accordance with an embodiment. As illustrated in FIGS. 1 and 2, after start-up a charge pump 200 is in a charging state, and a pumping capacitor $C_{PUMP}$ is charged to a level of the battery voltage VDDP. An internally created voltage $V_{INT}$ is combined therewith to store a VCP voltage higher than the battery voltage in charge pump capacitor $C_{CP}$ that may be output to the high-side gate driver 120 of the class D audio amplifier 100.

The internal voltage $V_{INT}$ on which the pumping capacitor $C_{PUMP}$ is superimposed may be created by supplying a constant voltage to the gate of NMOS transistor 220. This may be generated using a second charge pump 210 based on a controlled Dickson charge pump configuration. The generated reference voltage is added to VDDP stored in flying capacitor $C_{PUMP}$ using a source follower configuration using transistor/switch 220, PMOS transistor/switch 230 and NMOS transistor/switch 240, and diodes 260 and 270, as illustrated in FIG. 2. In order to produce the voltage VCP, two states are distinguished: a charging state and a pumping state.

As illustrated in FIG. 2, the charge pump 200 includes several components including, voltage reference node $C_{PM}$ that represents the negative terminal of flying capacitor $C_{PUMP}$, and $C_{PP}$ that represents the positive terminal. In a first clock cycle, transistor 240 conducts, and transistor M2 is open. $C_{PM}$ becomes 0V (VSSP) and $C_{PUMP}$ is charged through diode 270 to a voltage approximately VDDP minus the forward voltage of diode 270. The voltage across each diode may be represented by $V_{BE}$. In other words, diode 270 and switch 240 are turned on in a first clock cycle, and the switch 230 is switched open. As a result, node $C_{PM}$ is pulled to ground. With no current flowing through switch 230, the voltage drop from VDDP to $C_{PM}$ is VDDP, the capacitor $C_{PUMP}$ is charged to VDDP, and the voltage at the node $C_{PP}$ becomes VDDP.

In the second half of a clock cycle, in a pumping state, transistor 230 conducts, and transistor 240 is open, $C_{PM}$ takes on the value $V_{INT}$, and $C_{PUMP}$ is discharged through diode 260 to node VCP subtracting the forward voltage of diode 260.

Charging and pumping are done continuously using an internal clock signal alternately controlling both V1 and V2 such that switches 230 and 240 respectively never conduct at the same moment, because this would lead to large cross currents from VDDP to VSSP. The on-time of the switch 230 should be sufficient to fully charge $C_{PUMP}$ (i.e., $f_{SWITCHING} < 1/(2*5*R_{SWITCH}*C_{PUMP})$). After a certain period of time the VCP voltage will reach its steady-state voltage of approximately $V_{INT}-2*V_{BE}$ above VDDP.

In other words, in the pumping state, transistor 240 is switched off into a non-conducting state, switch 230 is closed, and diode 260 conducts. When $C_{PUMP}$ is fully charged, the switch 240 is switched off and the PMOS transistor 230 connecting the $C_{PM}$ node to $V_{INT}$ is closed. The node $C_{PM}$ goes to $V_{INT}$ and then the capacitor $C_{PUMP}$ is discharged through diode 260 onto $C_{CP}$, which results in $C_{CP}$ being charged to the voltage of $C_{PUMP}+V_{INT}-2V_{BE}$.

$V_{INT}$ plus the charge accumulated in $C_{PUMP}$ flows from $C_{PUMP}$ through $C_{CP}$ and diode 260 to $C_{CP}$. In the action of the charge pump 200, the combined voltage VDDP+$V_{INT}-2V_{BE}$ is output from output node CP to the high-side gate-driver 120.

In embodiments described herein, charge pump capacitor $C_{CP}$ may be charged to a combined voltage VCP higher than the battery voltage VDDP. This higher voltage may be produced in two ways.

Figure 3A:
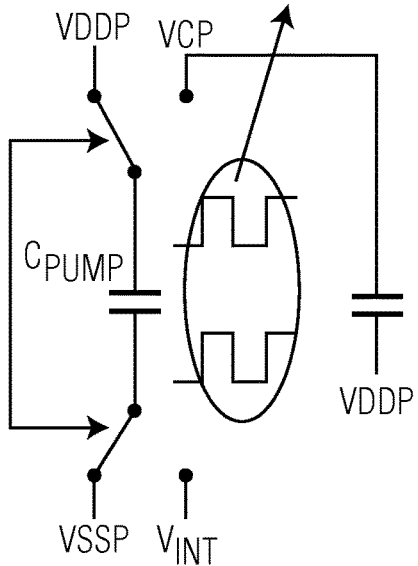
FIGS. 3A and 3B illustrate charge pump methods of creating voltages higher than the power supply voltage in accordance with FIG. 2.
Figure 3B:
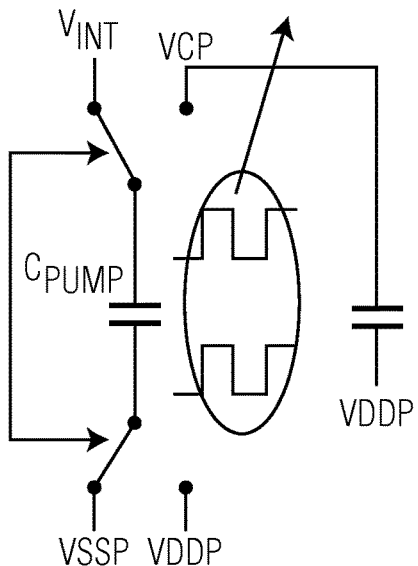

FIGS. 3A and 3B illustrate charge pump methods of creating voltages higher than the power supply voltage in accordance with FIG. 2. Illustrated in FIGS. 2, 3A, and 3B are two ways in which the higher voltage can be created.

As illustrated in FIGS. 2 and 3A, voltage jumps may be of $V_{INT}$ magnitude, in which VDDP is superimposed on $V_{INT}$. Using the first method, pumping capacitor $C_{pump}$ is charged up to the VDDP voltage and then stacked on the $V_{INT}$. This method represents a low voltage jump from VDDP to VDDP+$V_{INT}$ to create the combined voltage VCP, and has benefits of lower parasitic capacitive coupling resulting in low losses and low disturbance. $V_{INT}$ may be an internally produced voltage of a fixed range of 4V, 8V, or other value depending on the settings of the high side driver 120. VDDP can be up to about 50V.

In FIG. 3B, voltage jumps are of VDDP magnitude, in which $V_{INT}$ is superimposed onto VDDP to create the VCP voltage. Using the second method, the capacitor $C_{pump}$ is charged with the lower value $V_{INT}$ and then $V_{INT}$ is superimposed on top of VDDP. In this method, the voltage jump is much higher on the capacitor $C_{pump}$. In FIG. 3A, the voltage jump is from VSSP (GND) to $V_{INT}$, which can be a value of 4V, 8V, etc. In FIG. 3B there are large jumps that can cause issues with parasitic coupling but may have benefits such as fast charging speed.

The smaller voltage jumps illustrated in FIG. 3A may minimize the parasitic coupling, disturbances, and parasitic charge losses on the nodes during the superimposing phase. In the circuit illustrated in FIG. 3A, voltage ratings of the switches may be lower, so the circuit is designed with switches having a certain minimum resistance, and smaller devices can be used. This because the effects of on-resistance, RON, multiplied by the AREA of a MOST increases for increasing device breakdown voltage. A higher voltage jump requires a device with higher off-state breakdown voltage, $BV_{DS}$, consequently resulting in larger switch/device area. Scalability is a factor of breakdown voltage. Design choices using the methods illustrated in FIGS. 3A and 3B use voltage components that have various breakdown voltages to provide a desired size versus resistance ratio depending on the requirements and application of a device.

In an embodiment, when charging to the full potential of VDDP after the charging state and VDDP+$V_{INT}$ in the pumping state, diodes 260 and 270 may be replaced with switches. When using switches, careful timing is sought so that first and second switches do not conduct at the same time. A switch has beneficial characteristics such as no losses, but care may be taken with the timing so that the switches are not closed at the same time. A delay between closings may be designed into the system.

During operation of the charge pump 200, diode 270 and switch 240 conduct at the same time, and switch 230 and diode 260 conduct at a different time, alternating at a 50% duty cycle to constantly pump voltage into the capacitor $C_{PUMP}$ at $C_{CP}$. The capacitor voltage VCP initially will be roughly the voltage of $V_{INT}$, and in this case $V_{INT}$-2$V_{BE}$, which is the steady state voltage at unloaded charge pump.

As an example, if a battery VDDP=25V, and $V_{INT}$ is generated at 8V, neglecting the voltage loss of the diodes and switch conduction losses, then 25V+8V=33V is the voltage from VDDP to VSSP (ground). The charge pump 200 superimposes internally generated $V_{INT}$ on top of VDDP. Some voltage is lost because VCP loses some charge through the two diodes. The value of one diode is lost in the charging state, and another in the pumping (discharge) state. VCP, the absolute value of voltage to ground, will be VDDP+$V_{INT}$-2 diodes-Vswitches. Vswitches are a maximum sum of $V_{DS,\,SAT}$ of the current mirrors in node $C_{PM}$.

Protection schemes for protecting the charge pump device 200 from failures will be discussed with reference to the accompanying drawing figures. The class D audio amplifier 100 may be constructed as an integrated circuit chip (IC) with the charge pump circuit thereon. Several types of hazards that could affect the chip may exist or take place. One common circumstance where a failure could occur is when the IC is mounted during application processing on a printed circuit board (PCB). For instance there may be solder between legs of the IC or metal connections on a PCB that could connect near an input or output pin. There exist requirements for automotive and other industries that neighboring pins should be short-circuit proof. Protection mechanisms may also be designed within the charge pump design to prevent the system from being damaged.

Capacitors $C_{CP}$ and $C_{PUMP}$ may be external components to a class D integrated circuit audio amplifier. Consequently VCP, $C_{PP}$, and $C_{PM}$ nodes are external pins and should be able to withstand short-circuit conditions to either VDDP or VSSP.

In the circuit illustrated in FIG. 2, a short from VCP or $C_{PP}$ to VSSP could result in a large current because there is a direct path from VDDP to VSSP via diodes 260/270 and 270. A short from $C_{PM}$ to VSSP could also result in a large current from VDDP through transistor 220 and switch 230 to VSSP the moment the switch 230 conducts. A short from $C_{PM}$ to VDDP would result in a large current the moment the switch 240 would start conducting.

Figure 4:
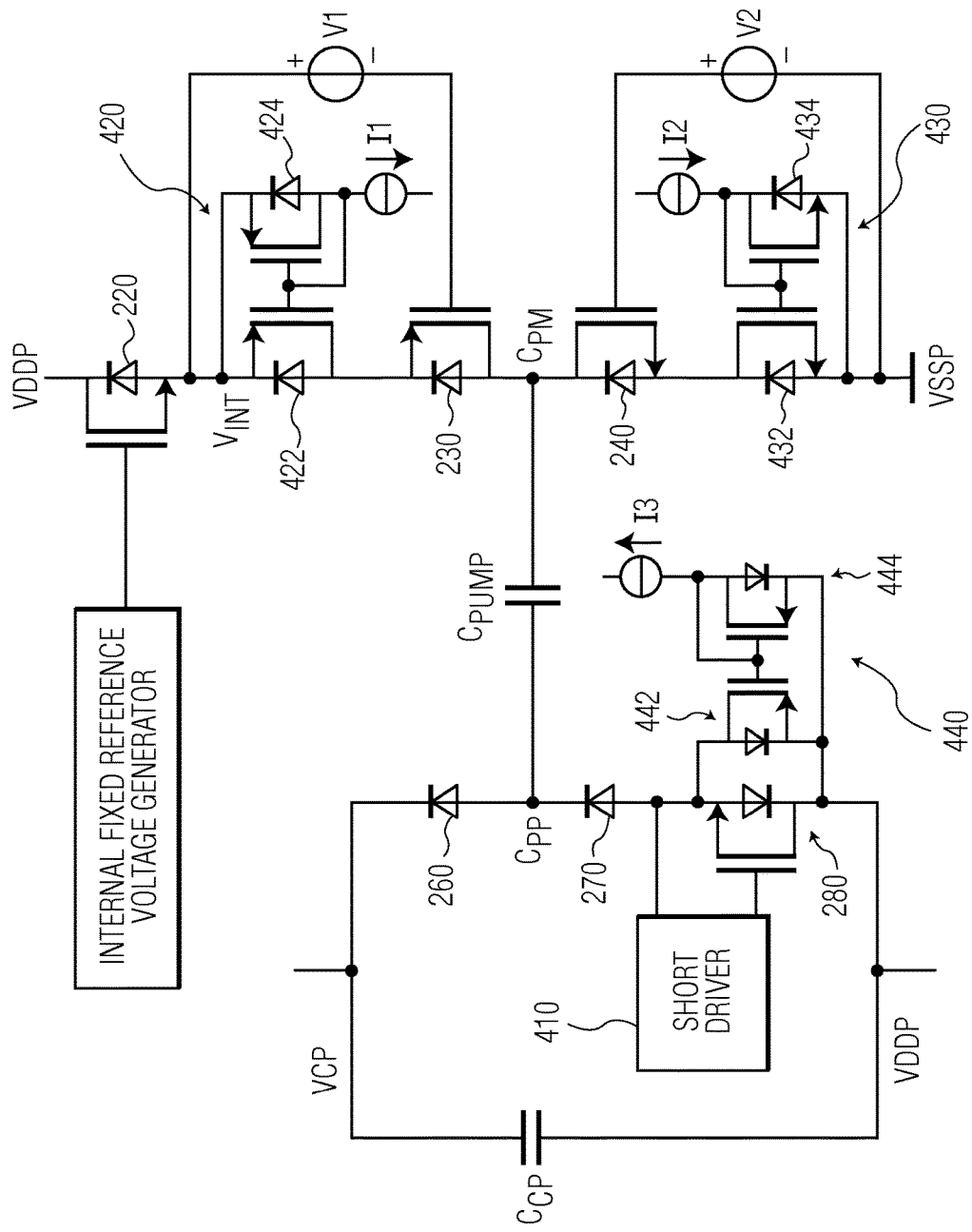
FIG. 4 illustrates a charge pump circuit with current-limiting and start-up protection according to an embodiment.

FIG. 4 illustrates a charge pump circuit with current-limiting and start-up protection. To protect against short to VSSD and VDDP conditions on the $C_{PM}$ node, current limiters 420 and 430 are added. For a short from VSSP to $V_{CP}$ and $C_{PP}$ nodes at start-up, a current limiter 440 positioned between VDDP and $C_{PP}$ is implemented that is active to prevent EOS during start-up. This protection is disabled just after start-up so it does not compromise the charge pump performance with respect to efficiency and output impedance. The mechanism acts as a self-diagnostic for shorts during charge pump start-up.

FIG. 4 illustrates a charge pump circuit with current-limiting and start-up protection. The protection for $C_{PM}$ and $C_{PP}$/VCP nodes are somewhat different and therefore explanation is divided in two sections.

To protect the $C_{PM}$ node against short conditions the maximum branch currents are limited by adding transistors 422 and 432 in series with the switches 230 and 240 respectively. Transistor pairs 422/424 and 432/434 act as current mirrors 420 and 430 respectively and are continuously active from start-up and during the operation of the charge pump 200. With the use of these protection circuits currents in neighboring branches may be accurately limited. The current limit depends on the values of I1 and I2 and the ratios of the current mirrors 420 and 430. Additional benefits include limiting the charge current of $C_{PUMP}$ as large rush-in currents can degrade capacitor life-time.

In a first clock cycle if a short develops on the $C_{PM}$ node to VSSP that corresponds with the switch 240 closing during operation, $C_{PM}$ will be connected to VSSD by the short, and no current will flow. However, in the next clock cycle, transistor 240 switches off and transistor 230 switches on, and without current limiter 420 there would be very high current running between VDDP and the $C_{PM}$ node, resulting from the high voltage VDDP across a low resistance state of transistor 230. Since VDDP can be a very high voltage, such as 30V or more, there can be significant power dissipation in switches 220 and 240, which may lead to damage.

To prevent a high current and electrical failure, current limiters 420 and 430 are used. Current limiting using current source I1 can be set to a few hundred milliamps, and should be sufficiently large to allow the capacitor $C_{PUMP}$ to be charged within the half of the clock period during the time that switch 240 is closed. There should be sufficient current in order to allow operation so that the capacitor $C_{PUMP}$ can be fully discharged in the time that the 230 switch is closed. Also when there is an adverse condition such as a short to ground, for example, and the switch 230 is closed, the current mirror circuit 420 will limit the current and therefore limit the dissipation and electrical overstress of the charge pump circuit 200.

A similar occurrence exists when $C_{PM}$ is connected to a certain power supply voltage, such as VDDP. If transistor 240 conducts, then there would be a short to ground. In this case, the current mirror 430 limits the current in transistor 240, thereby limiting the current in the branch node $C_{PM}$. The current has to be large enough to allow $C_{PUMP}$ to charge in the half of the clock period when switch 240 is closed. Thus using this configuration $C_{PM}$ is protected and the charge pump circuit 200 is protected during operation by current limiters 420 and 430. This design protects in case of a fault condition to external pins $C_{PM}$ and $C_{PP}$ that have to be short circuit safe.

In addition to fault and EOS protection during operation of the charge pump circuit 200, embodiments described herein include circuits and methods for fault detection during startup. Above, a protection strategy was described to protect the external $C_{PM}$ node. Embodiments described herein also include a protection strategy for $C_{PP}$ and VCP nodes.

Figure 5:
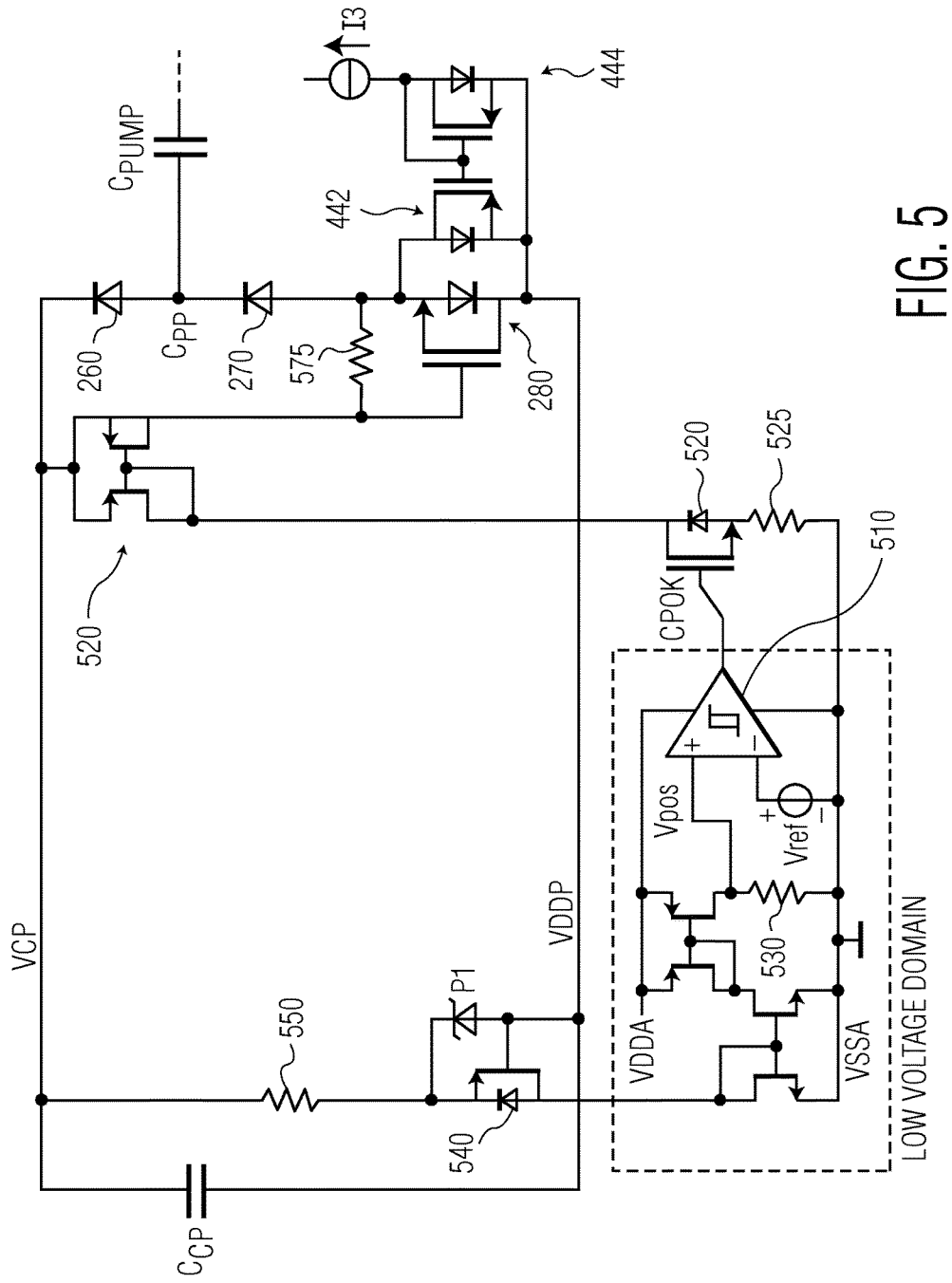
FIG. 5 illustrates a charge pump start-up detection circuit according to an embodiment.

FIG. 5 illustrates a charge pump start-up detection circuit according to an embodiment. Successful start-up of the charge pump 200 may be detected when VCP voltage rises to a certain voltage higher than VDDP. When VCP−VDDP>$V_{TH,M8}$, a threshold voltage of transistor 540, a current will flow from the VCP node through resistor 550, transistor 540, and the input of a current mirror to VSSA, a ground source. Depending on the ratio of the current mirrors in the low-voltage domain and the values of resistor 550 and resistor 530, the voltage Vpos is almost proportional to VCP−VDDP. For lowest voltage spread, resistors 550 and 530 should match.

A limiting current at the $C_{PM}$ node has been discussed. Embodiments presented herein describe mirrored transistors 442 and 444. Switch 280 may be open during a start-up event at the beginning of a clock cycle. The system is turned on and the current limiters 420 and 430 are active, switch 280 is open, and 440 is also active. When there is a short on $C_{PP}$ to ground, for example, the current will also be limited because switch 280 is open and the only way current can flow is through transistor 442. The current is thus limited by the current mirror 440. The node at $C_{PP}$ can therefore only pass a certain amount of current and cannot go any higher, and thereby the $C_{PP}$ node and the circuit survive electrical overstress.

In addition to the basic circuit, there is a detection mechanism. As illustrated in FIGS. 4 and 5, when the charge circuit starts pumping and there is a short on the $C_{PP}$ node, to ground for example, the $C_{PP}$ node will never produce a charge to be output capacitor $C_{CP}$. The $C_{PP}$ node will be grounded and the voltage VCP will never go above VDDP. When VCP is able to go higher than VDDP, there is no short. Thus when VCP is able to pump up and generate a voltage above a threshold VDDP, the system can determine that the device is able to pump and generate a VCP voltage. When this occurs, the current mirror transistor 442 can be bypassed. The switch 280 is closed and the circuit can operate efficiently. CPOK can be signaled to an external microcontroller that knows if CPOK is high the charge pump is able to start-up and in cases CPOK remains low there is a fault condition. In the latter case the microcontroller could signal this to the system (diagnostic) and shutdown the charge pump.

As illustrated in FIG. 5, diode D2 is in series with transistor 442. Transistors 442 and 444 form a current mirror. 442 acts as a current source limiting the branch current from VDDP through diode 270 towards $C_{PP}$ and the VCP node. The current limit is set by I3 and the ratio of the matched transistors 442 and 444. Transistor 280 acts as a switch allowing transistor 442 to be shorted. When both transistors 280 and 442 are off, the transistor back-gate diodes and diode 270 block and prevent any current flow in this branch.

At each 'cold' start of the charge pump (i.e. both $C_{CP}$ and $C_{PUMP}$ are fully discharged), switch 280 will be open and transistor 442 will limit the branch current. In case no short is present on either the $C_{PP}$ or VCP node, the voltage on VCP node will gradually increase above VDDP due to charge pump operation. When the VCP node voltage rises to a predetermined or programmable level above VDDP, it is assumed no short condition is present at moment of start-up. Then the short-driver circuit 410 closes switch 280 and shorts transistor 442. For charge pump operation after start-up transistor switch 280 is closed to enhance efficiency and realize low charge pump output impedance. One drawback to this configuration is that after start-up when M6 is closed the nodes $C_{PP}$ and VCP are not short-circuit safe anymore since the branch current is not limited anymore.

As illustrated in FIG. 5, when Vpos voltage exceeds a set reference voltage Vref, the output CPOK from comparator 510 goes high signaling that VCP is sufficiently higher compared to VDDP and charge pump start-up was successful. The comparator 510 has some hysteresis to prevent oscillation at the moment of detection.

When CPOK goes high, the gate-voltage of transistor 520 will be VDDA, and a current will flow through resistor 525. This current is mirrored via the VCP domain, and a voltage is created over resistor 575 closing transistor 280. To decrease the voltage spread, resistors 575 and 525 should match.

Various signals are sent to the microcontroller (not illustrated). There may be a short on transistor 280. As illustrated in FIG. 5, the CPOK signal is sent to a microcontroller. If there is sufficient voltage, CPOK goes high. If VCP is higher than VDDP, then the microcontroller signals high. If not, then circuit can shut down. In one mode, the circuit keeps pumping, looking for the correct signal, and when the short is removed, the circuit works.

Embodiments described herein generate a voltage higher than VDDP to operate drivers of the class D audio amplifiers. As discussed regarding FIG. 1, embodiments described herein generate a charge pump voltage VCP for high voltage of high side gate drivers, because the gate of the high side NMOS transistors may be driven and closed by generating a positive voltage at the gate higher than VDDP. The voltage of $V_{INT}$ can be varied, and VCP will follow $V_{INT}$ in a linear fashion.

Embodiments described herein prevent damage to an internal charge pump circuit as well as external capacitors and capacitor nodes connected thereto. Overstress conditions may be caused by a PCB short or other fault condition such as manufacturing process errors. The disclosed protection circuit is designed so that customers who buy products utilizing the class D audio amplifier can be ensured the products will work correctly, and will not damage other circuit components should failure occur. The circuits described herein are able to withstand overstress events. The $C_{PM}$ node may be protected, and the $C_{PP}$ node may be protected at startup against shorts.

It should be noted that the above-mentioned embodiments illustrate rather than limit the embodiments described herein, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The embodiments described herein can be implemented by means of hardware including several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:
1. A charge pump protection device comprising:
a power supply configured to produce a power supply voltage;

a charge pump configured to produce an output voltage that is substantially equal to the power supply voltage plus a second voltage lower than the power supply voltage, the charge pump including:
a second charge pump configured to produce the second voltage lower than the power supply voltage;
a pumping capacitor configured to store charge during a charging state and to discharge the charge during a pumping state thereof;
a plurality of switches configured to regulate the charging and pumping states;
a charge pump capacitor configured to store the output charge; and
at least one current limiter in series with at least one of the plurality of switches configured to limit current and prevent an electrical failure of the charge pump.

2. The device of claim 1, wherein the second voltage is superimposed on a pumping capacitor voltage to produce the output voltage.

3. The device of claim 1, wherein a pumping capacitor voltage is superimposed on the second voltage to produce the output voltage.

4. The device of claim 1, wherein the second charge pump circuit includes a Dickson charge pump.

5. The device of claim 1, wherein the charge pump protection circuit protects a first terminal of the pumping capacitor.

6. The device of claim 1, wherein the at least one current limiter includes a first current limiter in series with a first switch to protect the pumping capacitor node during a charging cycle.

7. The device of claim 6, wherein the first current limiter includes a MOS current mirror.

8. The device of claim 1, wherein the at least one current limiter includes a second current limiter in series with a second switch to protect the pumping capacitor node during a pumping cycle.

9. The device of claim 1, comprising a terminal of the pumping capacitor between the pumping capacitor and the charge pump capacitor and an electrical element to limit the current flow.

10. The device of claim 9, wherein the electrical element is a diode.

11. The device of claim 9, wherein the electrical element is a MOS transistor switch.

12. The device of claim 1, wherein voltage stored in the charge pump capacitor is used to power a high-side gate driver of a class D audio amplifier.

13. The device of claim 1, comprising a clock circuit to control timing within the charge pump detection circuit.

14. A charge pump detection device comprising:
a power supply configured to produce a power supply voltage;
a charge pump configured to produce an output voltage that is substantially equal to the power supply voltage plus a second voltage lower than the power supply voltage, a second charge pump configured to produce the second voltage lower than the power supply voltage, the charge pump including a pumping capacitor to store voltage during a charging state and discharge the voltage during a pumping state; and
a start-up protection circuit configured to protect a terminal of the charge pump capacitor during a start-up event including a current limiter positioned between the power supply and the terminal of the charge pump capacitor to limit current and prevent electrical overstress.

15. The device of claim 14, wherein the start-up protection circuit includes a MOS transistor that is open at the beginning of a clock cycle.

16. The device of claim 15, wherein when it is determined that the output voltage exceeds the power supply voltage, the MOS transistor is closed and the start-up protection circuit is bypassed.

17. The device of claim 14, wherein the start-up protection circuit comprises a current mirror.

18. The device of claim 1, wherein the start-up protection circuit is activated when the output voltage is determined not higher than the power supply voltage.

* * * * *